(12) United States Patent
Emadi et al.

(10) Patent No.: US 9,929,333 B1
(45) Date of Patent: Mar. 27, 2018

(54) IR THERMOPILE SENSOR WITH TEMPERATURE REFERENCE FORMED IN FRONT-END PROCESS

(71) Applicant: Maxim Integrated Products, Inc., San Jose, CA (US)

(72) Inventors: Arvin Emadi, San Jose, CA (US); Nicole D. Kerness, Menlo Park, CA (US); Cheng-Wei Pei, Belmont, CA (US); Craig A. Easson, San Jose, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 15/205,749

(22) Filed: Jul. 8, 2016

Related U.S. Application Data

(60) Provisional application No. 62/191,026, filed on Jul. 10, 2015.

(51) Int. Cl.
| | | |
|---|---|---|
| *H01L 29/04* | (2006.01) | |
| *H01L 35/32* | (2006.01) | |
| *H01L 35/14* | (2006.01) | |
| *H01L 35/34* | (2006.01) | |
| *G01J 5/12* | (2006.01) | |

(52) U.S. Cl.
CPC ............ H01L 35/32 (2013.01); G01J 5/12 (2013.01); H01L 35/14 (2013.01); H01L 35/34 (2013.01)

(58) Field of Classification Search
CPC ................. H01L 27/1248; G09G 3/3233
See application file for complete search history.

(56) References Cited

U.S. PATENT DOCUMENTS 8,851,748 B2 * 10/2014 Noda .................... G01J 5/02
　　　　　　　　　　　　　　　　　　　　　250/338.4

* cited by examiner

*Primary Examiner* — Elias M Ullah
(74) *Attorney, Agent, or Firm* — Advent, LLP

(57) ABSTRACT

An infrared thermopile sensor, an electronic device, and a method for fabricating an infrared thermopile sensor using a front-end process that employ example techniques in accordance with the present disclosure are described herein. In an implementation, the infrared thermopile sensor includes a silicon substrate that has been implanted during front-end processing to form an implant region; a passivation layer disposed on a first side of the silicon substrate, where the passivation layer forms a membrane; and an interlayer dielectric formed on the passivation layer, where the interlayer dielectric includes at least one thermopile that includes at least one thermocouple in series; and at least one metallic interconnect that electrically couples the at least one thermopile to a bond pad; and at least one bond pad interconnect that electrically couples the implant region to the bond pad.

20 Claims, 5 Drawing Sheets

IR THERMOPILE SENSOR WITH TEMPERATURE REFERENCE FORMED IN FRONT-END PROCESS

CROSS-REFERENCE TO RELATED APPLICATIONS

The present application claims the benefit under 35 U.S.C. § 119(e) of U.S. Provisional Application Ser. No. 62/191,026, filed Jul. 10, 2015, and titled "IR THERMOPILE SENSOR WITH TEMPERATURE REFERENCE FORMED IN FRONT-END PROCESS." U.S. Provisional Application Ser. No. 62/191,026 is herein incorporated by reference in its entirety.

BACKGROUND

A thermopile can include an electronic device that converts thermal energy into electrical energy. It is composed of several thermocouples often connected in series or in parallel. Thermopiles do not respond to absolute temperature, but generate an output voltage proportional to a local temperature difference or a temperature gradient. The output voltage of a thermopile can be in the range of tens or hundreds of microvolts. A thermopile can be used to generate electrical energy from, for instance, heat from electrical components, solar wind, radioactive materials, or combustion.

SUMMARY

An infrared thermopile sensor, an electronic device, and a method for fabricating an infrared thermopile sensor using a front-end process that employ example techniques in accordance with the present disclosure are described herein. In an implementation, the infrared thermopile sensor includes a silicon substrate that has been implanted during front-end processing to form an implant region; a passivation layer disposed on a first side of the silicon substrate, where the passivation layer forms a membrane; and an interlayer dielectric formed on the passivation layer, where the interlayer dielectric includes at least one thermopile that includes at least one thermocouple in series; and at least one metallic interconnect that electrically couples the at least one thermopile to a bond pad; and at least one bond pad interconnect that electrically couples the implant region to the bond pad. In an implementation, the electronic device includes a printed circuit board and at least one infrared thermopile sensor coupled to the printed circuit board.

In an implementation, the method for fabricating an infrared thermopile sensor includes implanting a silicon substrate during front-end processing to form at least one implant region, where the silicon substrate includes a first side and a second side; placing a passivation layer on the silicon substrate to form a membrane; forming an interlayer dielectric on the passivation layer; forming at least one thermoelectric element in the passivation layer; connecting the at least one thermoelectric element using metallic interconnects to form at least one thermopile; connecting the at least one thermopile to a bond pad; connecting the implant region to the bond pad; and micromachining the second side to release or expose the membrane.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1A:
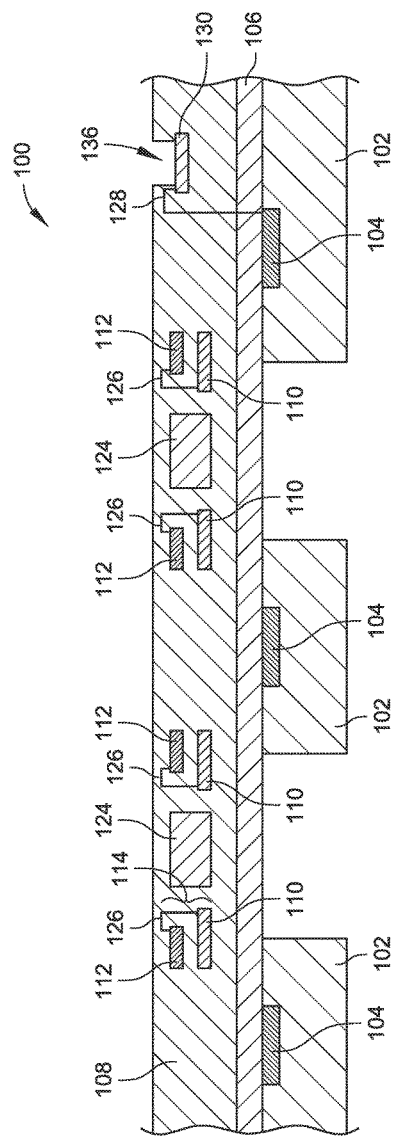
FIG. 1A is a partial cross-section view illustrating an embodiment of an infrared thermopile sensor that utilizes front end processing, in accordance with an example implementation of the present disclosure.

A thermopile fabrication process typically starts by passivating a silicon wafer with low-stress Nitride and Oxide layers to form a membrane. Thermoelectric layers (such as poly silicon, BiTe, BiSe, etc.) are subsequently formed in the back-end. Temperature sensitive layers such as other poly silicon or metallic layers are also formed in this stack at the back end. However, standard back-end layers, such as poly silicon layers, have too low temperature coefficients and thus not enough temperature resolution. Additionally, non-conventional back-end layers, such as nickel (Ni), can make the overall process costly and slow sue to process complexity.

Accordingly, an infrared thermopile sensor, an electronic device, and a method for fabricating an infrared thermopile sensor using a front-end process that employ example techniques in accordance with the present disclosure are described herein. In an implementation, the infrared thermopile sensor includes a silicon substrate that has been implanted during front-end processing to form an implant region; a passivation layer disposed on a first side of the silicon substrate, where the passivation layer forms a membrane; and an interlayer dielectric formed on the passivation layer, where the interlayer dielectric includes at least one thermopile that includes at least one thermocouple in series; and at least one metallic interconnect that electrically couples the at least one thermopile to a bond pad; and at least one bond pad interconnect that electrically couples the implant region to the bond pad. In an implementation, the electronic device includes a printed circuit board and at least one infrared thermopile sensor coupled to the printed circuit board.

In an implementation, the method for fabricating an infrared thermopile sensor includes implanting a silicon substrate during front-end processing to form at least one implant region, where the silicon substrate includes a first side and a second side; placing a passivation layer on the silicon substrate to form a membrane; forming an interlayer dielectric on the passivation layer; forming at least one thermoelectric element in the passivation layer; connecting the at least one thermoelectric element using metallic interconnects to form at least one thermopile; connecting the at least one thermopile to a bond pad; connecting the implant region to the bond pad; and micromachining the second side to release or expose the membrane.

The technology herein uses layers and/or implantation technology in the front end process (e.g., in the bulk silicon substrate) with a high temperature coefficient to determine the cold junction temperature of the infrared thermopile sensor. Most thermopile sensors use layers in the back-end process (e.g., poly-silicon). However, exemplary temperature coefficients of such back-end layers may be in the range of 500-800 ppm per degree, whereas front-end process implant layers in the silicon substrate can have temperature coefficients in the range of 3000-4000 ppm per degree and result in improved sensor temperature resolution. Using a front-end implantation process results in a simpler process, reduces cost by saving on an external reference temperature detector (RTD) component, and reduces product size.

Example Implementations

Figure 1B:
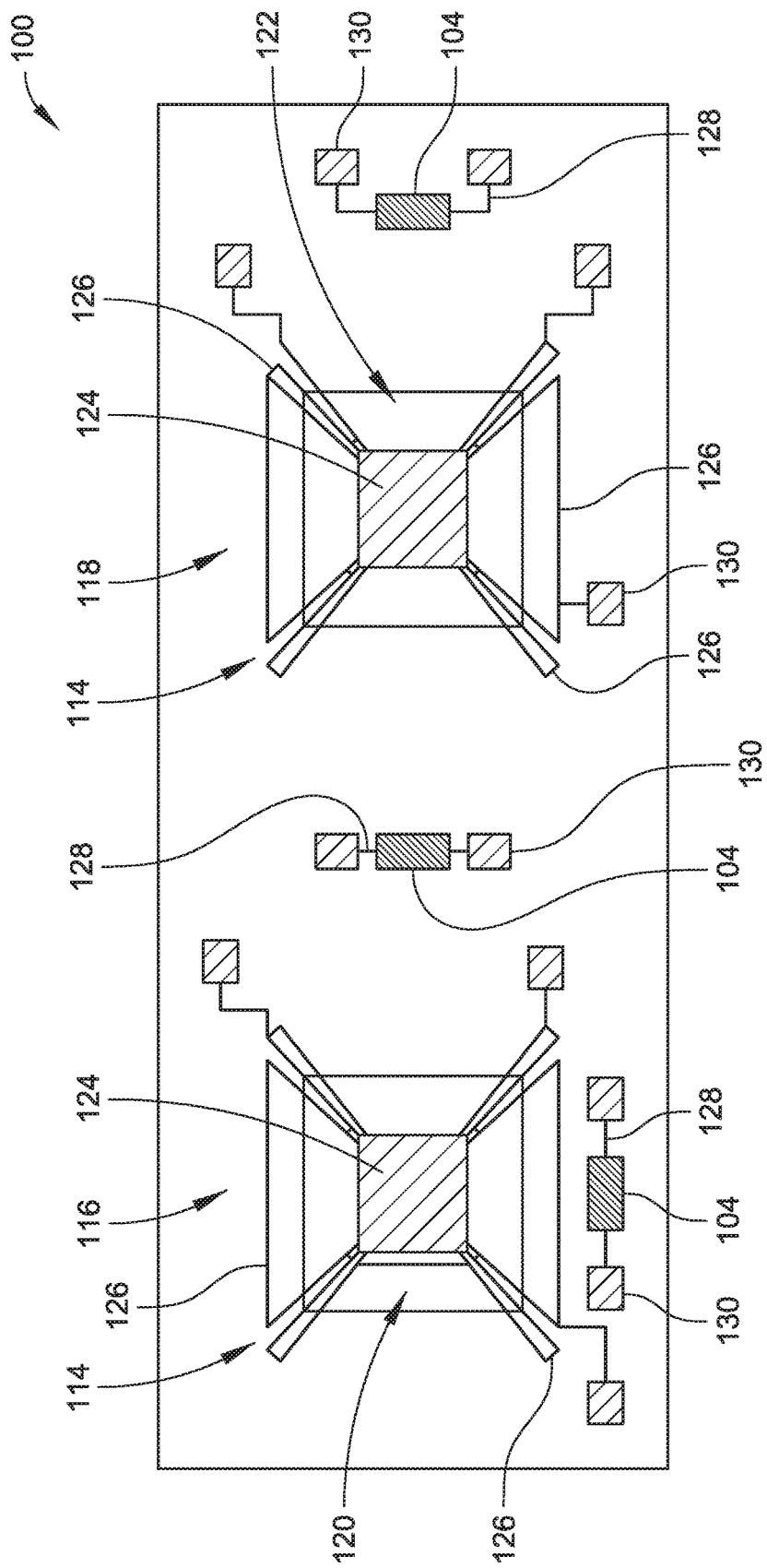
FIG. 1B is a top plan view illustrating an embodiment of an infrared thermopile sensor that utilizes front end processing, in accordance with an example implementation of the present disclosure.
Figure 1C:
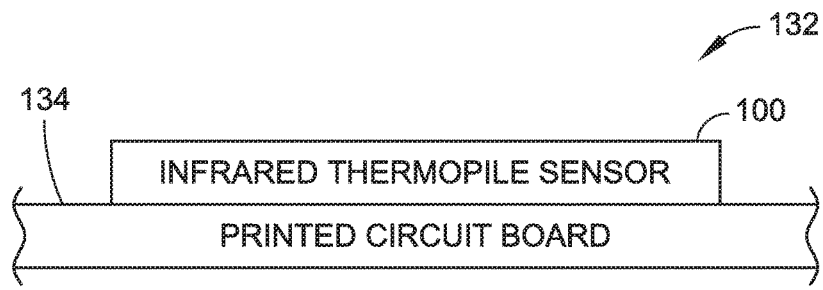
FIG. 1C is an environment view illustrating an embodiment of an electronic device including an infrared thermopile sensor that utilizes front end processing, in accordance with an example implementation of the present disclosure.

FIGS. 1A through 1C illustrate an infrared thermopile sensor 100 and an electronic device 132 in accordance with an example implementation of the present disclosure. In implementations, the infrared thermopile sensor 100 can include a silicon substrate 102. The silicon substrate 102 can be implanted using a front-end ion implantation process to form an implant region 104. Front-end processes can include the formation of transistors and other components directly in silicon (e.g., the silicon substrate 102), for example using ion implantation. Ion implantation can include using a process where accelerate ions are accelerated in an electrical field and impacted into a solid, such as the silicon substrate 102. Ion implantation can change the electrical properties of the silicon substrate 102 or other substrate. For example, the silicon substrate 102 may include an n-type diffusion region capable of providing extra conduction electrons as charge carriers. In another example, the silicon substrate 102 may include a p-type diffusion region capable of providing extra holes as charge carriers. In another example, the silicon substrate 102 may include an n-type well. In yet another example, the silicon substrate 102 may include a p-type well. It is contemplated that a variety of ion implantation configurations may be utilized.

In specific embodiments, ion implantation can include introducing a p-type dopant (e.g., boron, etc.) and/or n-type dopant (e.g., phosphorous, arsenic, antimony, etc.) in the silicon substrate 102 to modify the conductivity of the resulting implant region 104. In a specific embodiment, a p-type dopant (e.g., boron) is used to dope a silicon substrate 102 including an n-doped substrate to form an implant region 104 including a p-well. It is contemplated that the silicon substrate 102 may include other types of doped substrates and that the implant region 104 may be doped with other types of dopants. The implantation process may be optimized to result in the highest possible temperature coefficient, be stable, and show no measurable drift due to time or stress.

As shown in FIGS. 1A and 1B, the infrared thermopile sensor 100 can include a passivation layer 106 formed on the silicon substrate 102 using a back-end process, which can include processing steps that create dielectric layers, metal interconnections, and/or additional layers. A passivation layer 106 can serve to have minimal residual stress and protect the silicon substrate 102 and implant region 104. In some embodiments, the passivation layer 106 can include silicon dioxide ($SiO_2$) and/or silicon nitride (SiN). It is contemplated that passivation layer 106 may include other materials (e.g., oxide and/or nitride layers) that are stable and low-stress. The passivation layer 106 may include a variety of thicknesses. For instance, the thickness may range from about fifty nanometers to about one hundred nanometers. In a specific implementation, the passivation layer 106 includes a thickness less than or equal to one hundred nanometers. It is contemplated that other thicknesses may be utilized in accordance with the design requirements.

The infrared thermopile sensor 100 can include an interlayer dielectric 108 formed on the passivation layer 106. The interlayer dielectric 108 can be configured to include multiple thermoelectric layers and elements (e.g., first thermoelectric element 110, second thermoelectric element 112) for forming a thermocouple and/or thermopile. The interlayer dielectric 108 may include, for example, $SiO_2$, phosphosilicate glass (PSG), tetraethoxysilane (TEOS), borophosphosilicate glass (BPSG), and/or silicon nitride (SiN). Additionally, the interlayer dielectric 108 can function to provide thermal conductance between a hot junction and a cold junction, which may result in a higher temperature difference between an IR absorber 124 and the bulk of the silicon substrate 102 when heat is absorbed through electromagnetic radiation (e.g., light) incident upon the infrared thermopile sensor 100. The passivation layer 106 and/or the interlayer dielectric 108 can function as a relatively thin membrane structure (e.g., a first membrane area 120, a second membrane area 122, etc.) that is mechanically stable while providing a thermal conductance between a hot junction (e.g., the IR absorber 124 described herein) and a cold junction (e.g., bulk of the silicon substrate 102), which may result in a higher temperature difference between the hot junction and the cold junction when heat is absorbed from electromagnetic radiation (e.g., light) incident upon the infrared thermopile sensor 100.

As illustrated in FIG. 1A, the interlayer dielectric 108 can include a first thermoelectric element 110, a second thermoelectric element 112, and/or additional thermoelectric elements. In implementations, the first thermoelectric element 110, the second thermoelectric element 112, and/or additional thermoelectric elements can include materials such as N-doped poly silicon, P-doped poly silicon, metals such as aluminum or gold, and/or alloyed semiconductors such as BiTe, BiSb, BiSe, etc. Each of the thermoelectric layers and/or elements can exhibit a Seebeck effect where a temperature difference between dissimilar thermoelectric layers and/or elements produces a voltage difference between the dissimilar elements or layers. When heat is applied (e.g., infrared radiation, light) to one of two thermoelectric layers and/or elements, heated electrons flow toward the cooler one. When multiple thermoelectric layers and/or elements are electrically connected, direct current flows through the circuit.

In implementations and as illustrated in FIGS. 1A and 1B, the first thermoelectric element 110, the second thermoelectric element 112, and/or additional thermoelectric elements may be configured to be discontinuous and/or formed in separate locations on or within the interlayer dielectric 108. The first thermoelectric element 110 and the second thermoelectric element 112, when electrically coupled, form a thermocouple 114. Multiple thermocouples 114 electrically coupled in series can form a thermopile device (e.g., first thermopile 116, second thermopile 118, etc.). The infrared thermopile sensor 100 can include at least one thermopile device. The first thermoelectric element 110, the second thermoelectric element 112, and additional thermoelectric elements can be electrically coupled using at least one metallic interconnect 126. In implementations, a metallic interconnect 126 can include using metal traces and/or vias to connect multiple thermoelectric elements (e.g., the first thermoelectric element 110, the second thermoelectric element 112). In implementations, the metallic interconnect(s) 126 can include a conductive material, such as aluminum.

In implementations, the infrared thermopile sensor 100 can include at least one bond pad 130 coupled to an implant region 104, a thermopile, and/or another component of the infrared thermopile sensor 100 using a bond pad interconnect 128. In an embodiment, the bond pad 130 may be exposed by a bond pad opening 136 or an etched portion of the interlayer dielectric 108. In implementations, the bond pad 130 can include aluminum. However, the bond pad 130 may include other conductive materials. A portion of the interlayer dielectric 108 can be etched and/or removed using an etching or other mechanical removal process to form the bond pad opening 136 and expose the bond pad 130. Additionally, the bond pad 130 may be electrically coupled to an implant region 104, a first thermopile 116, a second thermopile 118, and/or other components of the infrared thermopile sensor 100 using a bond pad interconnect 128, which may include aluminum or other conductive materials. In one specific example, the infrared thermopile sensor 100 can include a thermopile device (e.g., first thermopile 116) having multiple bond pads 130.

In the embodiments illustrated in FIGS. 1A and 1B, the infrared thermopile sensor 100 may include an IR absorber 124. In implementations, the IR absorber 124 can be disposed in the interlayer dielectric 108 and/or as a component of at least one thermopile. In one specific example, the IR absorber 124 can include at least one patterned metal layer (e.g., titanium, aluminum, copper, etc.) that functions to absorb more infrared energy and generate additional heat. The IR absorber 124 may include multiple materials (e.g., layers of materials) and can provide absorption and/or reflective functionality to the infrared thermopile sensor 100.

In a specific embodiment, the IR absorber 124 can include a highly infrared absorbing layer including at least one porous metal (e.g., black gold, a black photoresist, etc.). In another specific embodiment, the IR absorber 124 can include an absorption stack, which further includes a first layer, a second layer (e.g., n-type poly-silicon, amorphous silicon, germanium, or the like), and/or a third layer (e.g., titanium). In some specific implementations, the first layer can include a material that provides reflective characteristics. For example, the first layer may include an aluminum material having a thickness ranging from about twenty nanometers to about one hundred nanometers. In some specific implementations, the second layer can include a long wavelength infra-red (LWIR) material that provides wave phase shift (e.g., quarter wave phase shift) characteristics. For example, the second layer may include an n-type poly-silicon material, an amorphous silicon material, or a germanium, and the second layer may have a thickness ranging from about five hundred nanometers to about seven hundred and fifty nanometers. In some specific implementations, the third layer can include a material that provides absorption and/or reflective characteristics. For example, the third layer may include a titanium material having a thickness ranging from about two nanometers to about five nanometers. It is contemplated that the IR absorber 124 and/or layer within the IR absorber 124 can include other additional layers and/or materials.

In implementations, multiple electrically separate thermopile devices may be formed on a die (e.g., a single silicon substrate 102). In the specific embodiment shown in FIGS. 1A and 1B, an infrared thermopile sensor 100 includes a first thermopile 116 and a second thermopile 118. In this embodiment, implant regions 104 (e.g., p-wells) have been formed in the bulk of the silicon substrate 102 and are electrically connected to bond pads 130 using bond pad interconnects 128. Forming the first thermopile 116 and the second thermopile 118 on a single silicon substrate 102 results in a thermal short between the cold contacts, which may be necessary when either the first thermopile 116 or the second thermopile 118 is used to cancel a dark and/or unwanted signal from the other. In these specific implementations, the cold contacts of the first thermopile 116 and the second thermopile 118 may be at the same temperature due to the high thermal conductivity of silicon. Additionally, In some implementations, an infrared thermopile sensor 100 can include multiple thermopiles. FIG. 1B illustrates a top plan view illustrating a first thermopile 116 and a second thermopile 118 on a silicon substrate 102. FIG. 1B shows one specific embodiment where the implant regions 104 and/or bond pads 130 may be formed in different locations in relation to the first membrane area 120 and the second membrane area 122. In the specific embodiment illustrated in FIG. 1B, an infrared thermopile sensor 100 may include a first thermopile 116 having a first membrane area 120 and a second thermopile 118 having a second membrane area 122, where the first thermopile 116 and the second thermopile 118 are electrically separated.

In implementations, the silicon substrate 102 may be further processed using a micromachining and/or etching process to remove a portion of the silicon substrate 102 for releasing the thermopile membrane (e.g., first membrane area 120, second membrane area 122, etc.) and forming free standing dielectric stacks, as shown in FIG. 1A. When IR light heats the center of membrane, the IR light is absorbed and generates heat. The generated heat generates a temperature difference between the center of membrane and the bulk of the silicon substrate 102 (or free standing dielectric stacks). Releasing the membrane by removing a portion of the silicon substrate 102 creates a large thermal resistance between center of the membrane and the bulk of the silicon substrate 102. Even a small amount of heat generated by IR light can cause a temperature difference (temperature delta). This temperature difference is detected by the thermocouples 114 placed in series to form the thermopile.

As shown in FIG. 1C, the infrared thermopile sensor 100 can be electrically and/or mechanically coupled (e.g., using an adhesive, a solder ball array, wire bonding) to another component (e.g., a printed circuit board 134) to form an electronic device 132.

Example Processes

Figure 2:
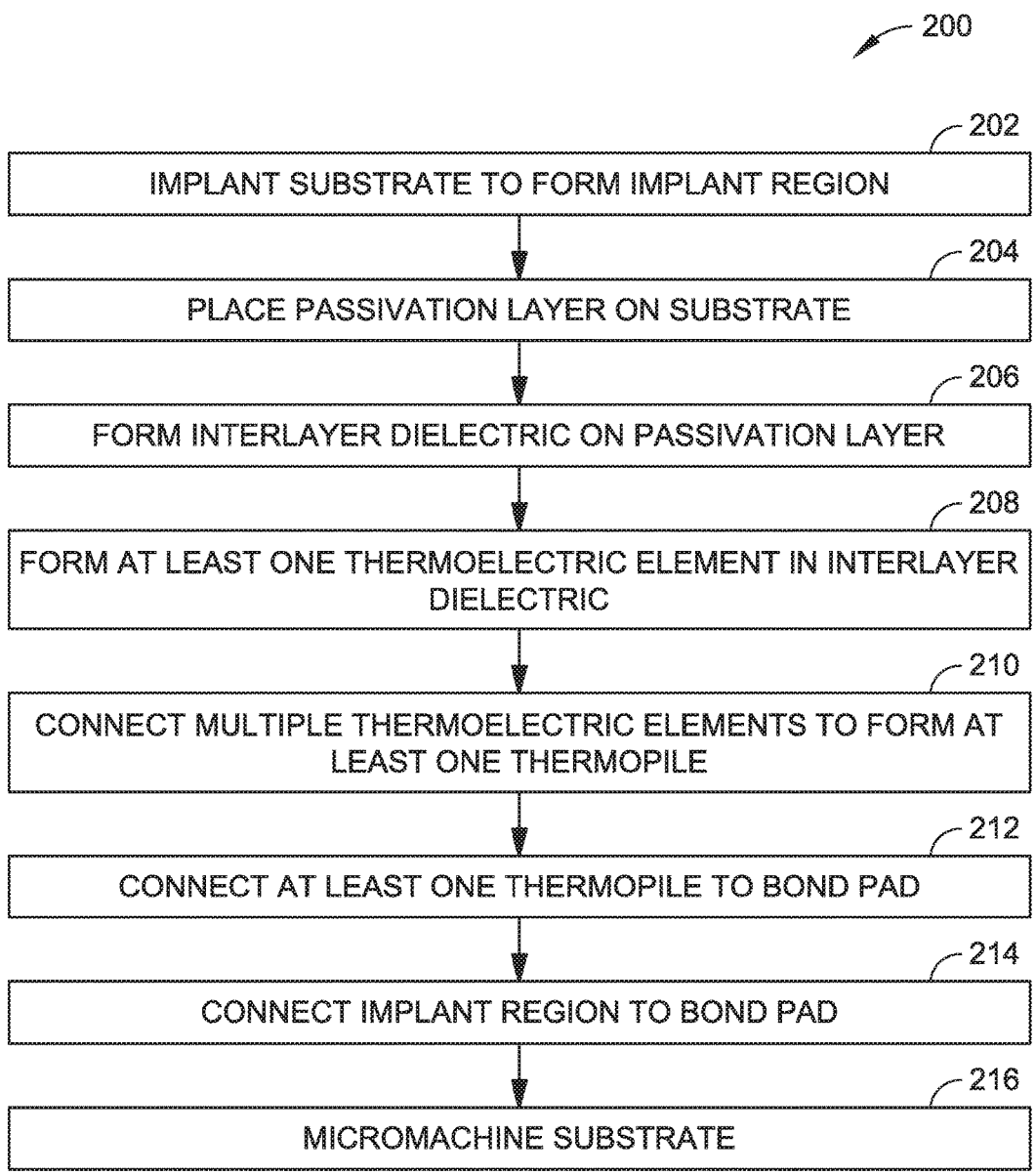
FIG. 2 is a flow diagram illustrating an example process for fabricating an infrared thermopile sensor that utilizes front end processing, such as the infrared thermopile sensor illustrated in FIGS. 1A through 1C.

FIG. 2 illustrates an example process 200 that employs techniques for fabricating infrared thermopile sensors, such as the infrared thermopile sensor 100 shown in FIGS. 1A through 1C. In one or more implementations, the process 200 may utilize suitable complementary metal-oxide-semiconductor (CMOS) processing techniques to fabricate the infrared thermopile sensor 100. FIGS. 3A through 3E illustrate a section 300 of an infrared thermopile sensor 100 during fabrication.

Figure 3A:
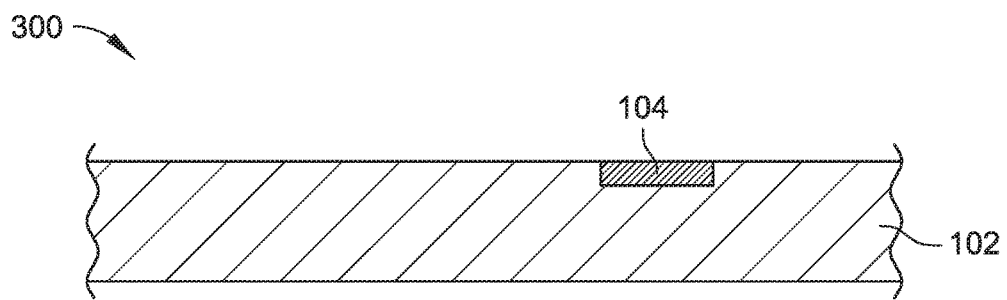
FIG. 3A is a diagrammatic partial cross-sectional view illustrating the fabrication of an infrared thermopile sensor, such as the infrared thermopile sensor utilizing front end processing shown in FIGS. 1A through 1C, in accordance with the process shown in FIG. 2.

As shown in FIG. 3A, a substrate is implanted to form at least one implant region (Block 202). In implementations, the silicon substrate 102 includes at least a portion of a silicon wafer. The silicon substrate 102 can be doped using a front-end process, such as an ion implantation process, to form an implant region 104 (e.g., a p-well).

Figure 3B:
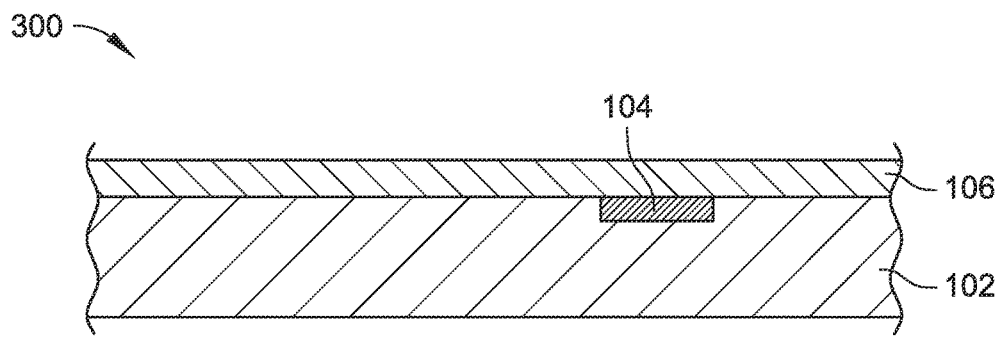
FIG. 3B is a diagrammatic partial cross-sectional view illustrating the fabrication of an infrared thermopile sensor, such as the infrared thermopile sensor utilizing front end processing shown in FIGS. 1A through 1C, in accordance with the process shown in FIG. 2.

As illustrated in FIG. 3B, a passivation layer is placed on the substrate (Block 204). In implementations, placing the passivation layer 106 on the silicon substrate 102 can include using a deposition process to form an oxide (e.g., a silicon dioxide membrane) and/or a nitride layer. Illustrated in FIG. 3C, an interlayer dielectric is formed on the passivation layer (Block 206). Forming the interlayer dielectric 108 can include depositing a dielectric material on the passivation layer 106. In some implementations, the interlayer dielectric 108 can be deposited in multiple layers where the layers may be the same dielectric material or may be different dielectric materials. Some deposition processes for forming the interlayer dielectric 108 and/or the passivation layer 106 may include chemical vapor deposition, sputtering, etc. It is contemplated that other processes may be utilized to form the interlayer dielectric 108 and/or the passivation layer 106.

Figure 3C:
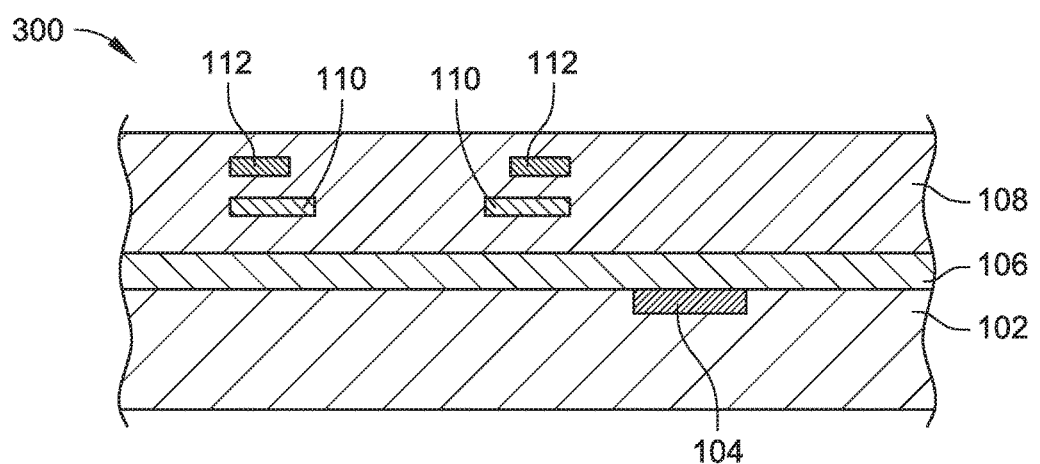
FIG. 3C is a diagrammatic partial cross-sectional view illustrating the fabrication of an infrared thermopile sensor, such as the infrared thermopile sensor utilizing front end processing shown in FIGS. 1A through 1C, in accordance with the process shown in FIG. 2.
Figure 3D:
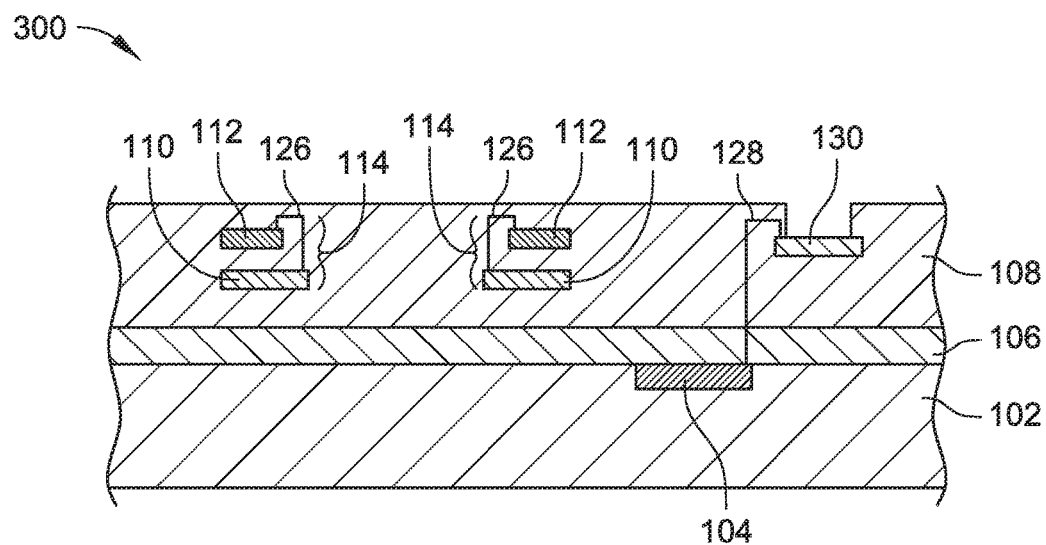
FIG. 3D is a diagrammatic partial cross-sectional view illustrating the fabrication of an infrared thermopile sensor, such as the infrared thermopile sensor utilizing front end processing shown in FIGS. 1A through 1C, in accordance with the process shown in FIG. 2.

As shown in FIG. 3C, at least one thermoelectric element is formed in the interlayer dielectric (Block 208). In implementations, forming the at least one thermoelectric element (e.g., first thermoelectric element 110, second thermoelectric element 112, etc.) can include doping a portion of the interlayer dielectric 108 (e.g., n-doped polysilicon, p-doped polysilicon). In a specific implementation, forming a thermoelectric element may include depositing a metallic layer (e.g., aluminum) as the thermoelectric element. Illustrated in FIG. 3D, the at least one thermoelectric element is connected to form at least one thermopile (Block 210). In implementations, connecting the at least one thermoelectric element(s) can include using a via formation process and/or other lithography and deposition process to form a metallic interconnect 126 between the at least one thermoelectric element(s). Connecting multiple thermoelectric elements creates a thermocouple, and in turn connecting multiple thermocouples in series creates a thermopile device. In implementations, the thermoelectric elements and the thermocouples 114 can be connected using multiple metallic interconnects 126.

Then, the at least one thermopile is connected to a bond pad (Block 212). Additionally, the implant region is connected to the bond pad (Block 214). In implementations, connecting the thermopile to a bond pad 130 and/or connecting the implant region 104 to a bond pad 130 can include forming a metallic interconnect 126 and/or a bond pad interconnect 128 using processes similar to those disclosed above. In an additional processing step illustrated in FIG. 3D, at least a portion of the interlayer dielectric 108 may be etched and/or removed to form a bond pad opening 136 and open up the bond pad 130 for further electrical access.

Figure 3E:
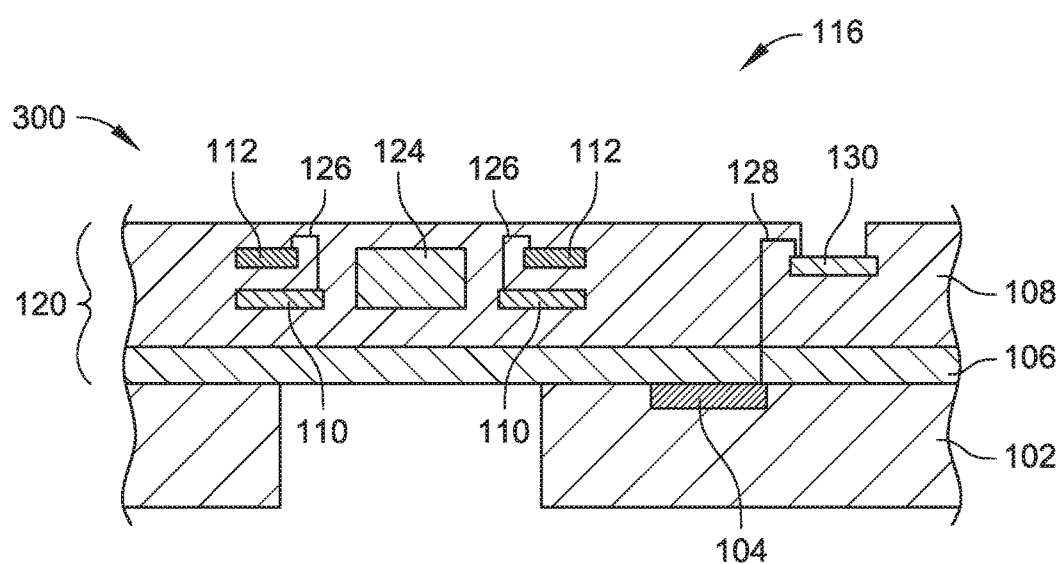
FIG. 3E is a diagrammatic partial cross-sectional view illustrating the fabrication of an infrared thermopile sensor, such as the infrared thermopile sensor utilizing front end processing shown in FIGS. 1A through 1C, in accordance with the process shown in FIG. 2.

The substrate is micro-machined (Block 216). In some implementations, the silicon substrate 102 can be processed and/or micro-machined to remove a portion of the silicon substrate 102 and release the membrane area as shown in FIG. 3E. Removing a portion of the silicon substrate 102 forms free standing dielectric stacks. One example of a process for micro-machining and/or removing a portion of the silicon substrate 102 may include etching.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. An infrared thermopile sensor, comprising:
   a silicon substrate that has been implanted during front-end processing to form an implant region;
   a passivation layer disposed on a first side of the silicon substrate, where the passivation layer forms a membrane; and
   an interlayer dielectric formed on the passivation layer, where the interlayer dielectric includes
      at least one thermopile that includes at least one thermocouple in series, the at least one thermocouple including a first thermoelectric element disposed over a second thermoelectric element;
      at least one metallic interconnect that electrically couples the at least one thermopile to a bond pad; and
      at least one bond pad interconnect that electrically couples the implant region to the bond pad.

2. The infrared thermopile sensor in claim 1, wherein the silicon substrate includes an n-dope silicon substrate and the implant region includes a p-well.

3. The infrared thermopile sensor in claim 1, wherein the silicon substrate has been partially removed on a second side to form at least one free standing dielectric stack.

4. The infrared thermopile sensor in claim 1, wherein the passivation layer includes a layer of silicon nitride.

5. The infrared thermopile sensor in claim 1, wherein the passivation layer includes a layer of silicon dioxide.

6. The infrared thermopile sensor in claim 1, wherein the at least one thermocouple includes a thermoelectric element that includes at least one of an n-doped polysilicon or a p-doped polysilicon.

7. The infrared thermopile sensor in claim 1, wherein the interlayer dielectric includes an IR absorber.

8. The infrared thermopile sensor in claim 7, wherein the IR absorber includes a highly IR absorbing layer that includes a porous metal.

9. The infrared thermopile sensor in claim 1, wherein the bond pad includes aluminum.

10. The infrared thermopile sensor in claim 1, wherein a thermopile is coupled to multiple bond pads.

11. An electronic device, comprising:
a printed circuit board; and
at least one infrared thermopile sensor coupled to the printed circuit board, the at least one infrared thermopile sensor including
a silicon substrate that has been implanted to form an implant region;
a passivation layer disposed on a first side of the silicon substrate, where the passivation layer forms a membrane; and
an interlayer dielectric formed on the passivation layer, where the interlayer dielectric includes
at least one thermopile that includes at least one thermocouple in series, the at least one thermocouple including a thermoelectric element that includes at least one of an n-doped polysilicon or a p-doped polysilicon; and
at least one metallic interconnection that electrically couples the at least one thermopile to a bond pad and electrically couples the implant region to the bond pad.

12. The electronic device in claim 11, wherein the silicon substrate includes an n-dope silicon substrate and the implant region includes a p-well.

13. The electronic device in claim 11, wherein the silicon substrate has been partially removed on a second side to form at least one free standing dielectric stack.

14. The electronic device in claim 11, wherein the at least one thermocouple including a first thermoelectric element disposed over a second thermoelectric element.

15. The electronic device in claim 11, wherein the interlayer dielectric includes an IR absorber.

16. An infrared thermopile sensor, comprising:
a silicon substrate that has been implanted during front-end processing to form an implant region;
a passivation layer disposed on a first side of the silicon substrate, where the passivation layer forms a membrane; and
an interlayer dielectric formed on the passivation layer, where the interlayer dielectric includes
an infrared (IR) absorber, the IR absorber including a highly IR absorbing layer that includes a porous metal;
at least one thermopile that includes at least one thermocouple in series;
at least one metallic interconnect that electrically couples the at least one thermopile to a bond pad; and
at least one bond pad interconnect that electrically couples the implant region to the bond pad.

17. The infrared thermopile sensor as recited in claim 16, wherein the silicon substrate includes an n-dope silicon substrate and the implant region includes a p-well.

18. The infrared thermopile sensor as recited in claim 16, wherein the silicon substrate has been partially removed on a second side to form at least one free standing dielectric stack.

19. The infrared thermopile sensor as recited in claim 16, wherein the at least one thermocouple including a first thermoelectric element disposed over a second thermoelectric element.

20. The infrared thermopile sensor in claim 16, wherein the at least one thermocouple includes a thermoelectric element that includes at least one of an n-doped polysilicon or a p-doped polysilicon.

* * * * *